United States Patent [19]

Wirz et al.

[11] Patent Number: 4,869,802
[45] Date of Patent: Sep. 26, 1989

[54] APPARATUS FOR THE PRODUCTION OF COATINGS OF UNIFORM THICKNESS PROFILE ON SUBSTRATES, ESPECIALLY BY CATHODE SPUTTERING

[75] Inventors: Peter Wirz, Waldernbach; Heinz-Wilhelm Pfannekuche, Hanau; Thomas Bathon, Moembris; Karl Eckert, Nidderau, all of Fed. Rep. of Germany

[73] Assignee: Leybold Aktiengesellschaft, Hanau, Fed. Rep. of Germany

[21] Appl. No.: 177,969

[22] Filed: Apr. 5, 1988

[30] Foreign Application Priority Data

Feb. 20, 1988 [DE] Fed. Rep. of Germany ....... 3805380

[51] Int. Cl.⁴ .............................................. C23C 14/34
[52] U.S. Cl. .................. 204/298; 204/192.12
[58] Field of Search ......... 204/192.1, 192.12, 298 SC, 204/298 EM, 298 EE, 298 WH, 298 ME, 298 MC, 298 MB, 298 MR

[56] References Cited

U.S. PATENT DOCUMENTS

| | | | |
|---|---|---|---|
| 3,039,952 | 6/1962 | Fairchild et al. | 204/298 |
| 4,548,698 | 10/1985 | Sellschopp | 204/298 |
| 4,650,064 | 3/1987 | Slabaugh | 204/298 |

Primary Examiner—Nam X. Nguyen
Attorney, Agent, or Firm—Felfe & Lynch

[57] ABSTRACT

In an apparatus for the production of coatings with a uniform thickness profile on substrates by cathode sputtering, a substrate carriage held and guided between rollers is provided, which can be driven through the coating chamber, and which has substrate disks rotatably mounted on its side facing the cathode. The axes of rotation of the substrate disks are disposed transversely of the plane of movement of the substrate carriage. On the side of the substrate carriage facing away from the cathode, a row of permanent magnets is fixedly disposed on magnet holders. The permanent magnets produce a disk current in magnetic disks which are joined for co-rotation with the pivot shafts of the substrate disks. On account of the disk current, the magnetic disks, and with them also the substrate disks, are made to rotate in passing along the row of magnets.

6 Claims, 3 Drawing Sheets

APPARATUS FOR THE PRODUCTION OF COATINGS OF UNIFORM THICKNESS PROFILE ON SUBSTRATES, ESPECIALLY BY CATHODE SPUTTERING

BACKGROUND OF THE INVENTION

The invention relates to an apparatus for the production of coatings of uniform thickness profile on substrates, especially by cathode sputtering, consisting of a coating chamber, a sputtering cathode held fixedly in the latter, and a substrate carriage held and guided on rails and/or between slides or rolling bodies and moving through the coating chamber across the sputtering cathode.

An apparatus is known (DE-OS No. 33 06 870), consisting of a sputtering cathode and substrate holders on a common chassis which can travel with respect to the sputtering cathode while performing a continuous rotatory movement of the substrate holders. For this purpose a driving wheel is disposed on the chassis with its axis of rotation perpendicular to the direction of travel, a driving means being disposed parallel to the direction of travel, with which the driving wheel is in engagement on a portion of its way, and the driving wheel being coupled to a substrate holder. The driving means is in the form of an endless chain which is carried on two sprockets situated in tandem in the direction of travel, and, by means of a motor, it can be made to circulate, each driving wheel cooperating with a substrate holder through a bevel gear drive.

This known apparatus has the disadvantage, among others, of being extremely complicated and bulky and at the same time not very reliable in operation.

It is the object of the present invention to create an apparatus of the above-described type which will operate without mechanical transmission, will permit an especially low type of construction, and will operate without maintenance, so that in no case will it be necessary to open the coating chamber.

This is achieved according to the invention in that one or more substrate disks are mounted rotatably on the substrate carriage, and their axes of rotation are vertical with respect to the plane of movement of the substrate carriage, while on the side of the substrate carriage facing away from the cathode a plurality of magnets arranged in a row are mounted fixedly in the coating chamber with their direction of magnetization perpendicular to the direction of movement of the substrate carriage; the magnetization of each two adjacent magnets is antiparallel, and the magnet row extends in a plane parallel to the direction of movement of the substrate carriage and cooperates with magnetic disks which are fastened on the hub of the substrate disk and whose direction of magnetization is perpendicular to the hub axis.

In an alternative embodiment of the apparatus, one or more substrate disks are rotatably mounted on the substrate carriage on its side facing the cathode, and their axes of rotation are transverse to the plane of movement of the substrate carriage, while on the side of the substrate carriage facing away from the cathode an electromagnet is disposed fixedly in the coating chamber, with a yoke whose pole faces cooperate with a magnetic plate and whose direction of magnetization is perpendicular to the hub axis, and while the pole faces, which are turned toward one another, are disposed parallel to the direction of movement of the substrate carriage.

Advantageously, the substrate carriage is in the form of a substantially rectangular plate on whose upper side a plurality of substrate disks are rotatably mounted, the corresponding pivot shafts being each brought downwardly through bearing bores in the substrate carriage and affixed to magnetic disks which cooperate with magnets of the magnet row or with the electromagnet.

Preferably, not only every substrate disk but also every corresponding magnetic disk is provided with a hub, both of them being joined together co-rotationally by a pivot shaft, each pair of hubs cooperating with a rolling bearing whose cage is held on the substrate carriage.

In order to produce a disk current that will be especially effective in the sense of rotation of the substrate disks, the row of magnets extending lengthwise of the direction of movement of the substrate carriage is so disposed that the magnetic disks move directly and at a short distance past the individual magnets on their way through the coating chamber.

The row of magnets is best disposed laterally beside the magnetic disk rotating with the hub and immediately underneath the substrate carriage and parallel to the latter.

The invention admits of a great variety of embodiments; one of them is represented diagrammatically in detail in the appended drawings, wherein.

Figure 1:
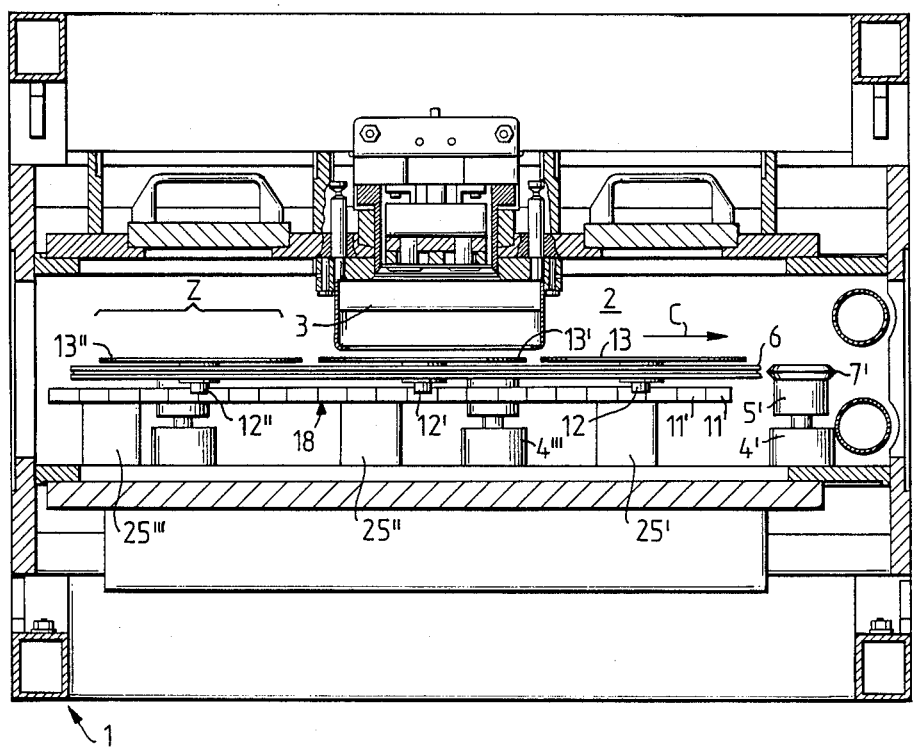
FIG. 1 shows a coating chamber with a sputtering cathode fastened to the roof and a substrate carriage mounted on rollers underneath the cathode, and a row of permanent magnets held between the substrate carriage and the floor of the coating chamber.
Figure 2:
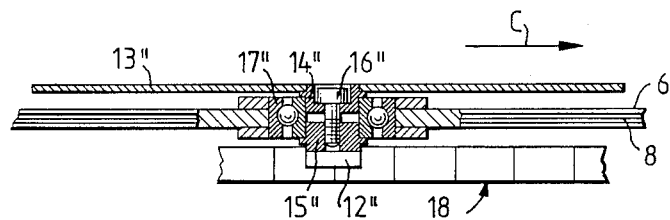
FIG. 2 is an enlarged detail of section Z of the substrate carriage according to FIG. 1, here shown in cross section.
Figure 3:
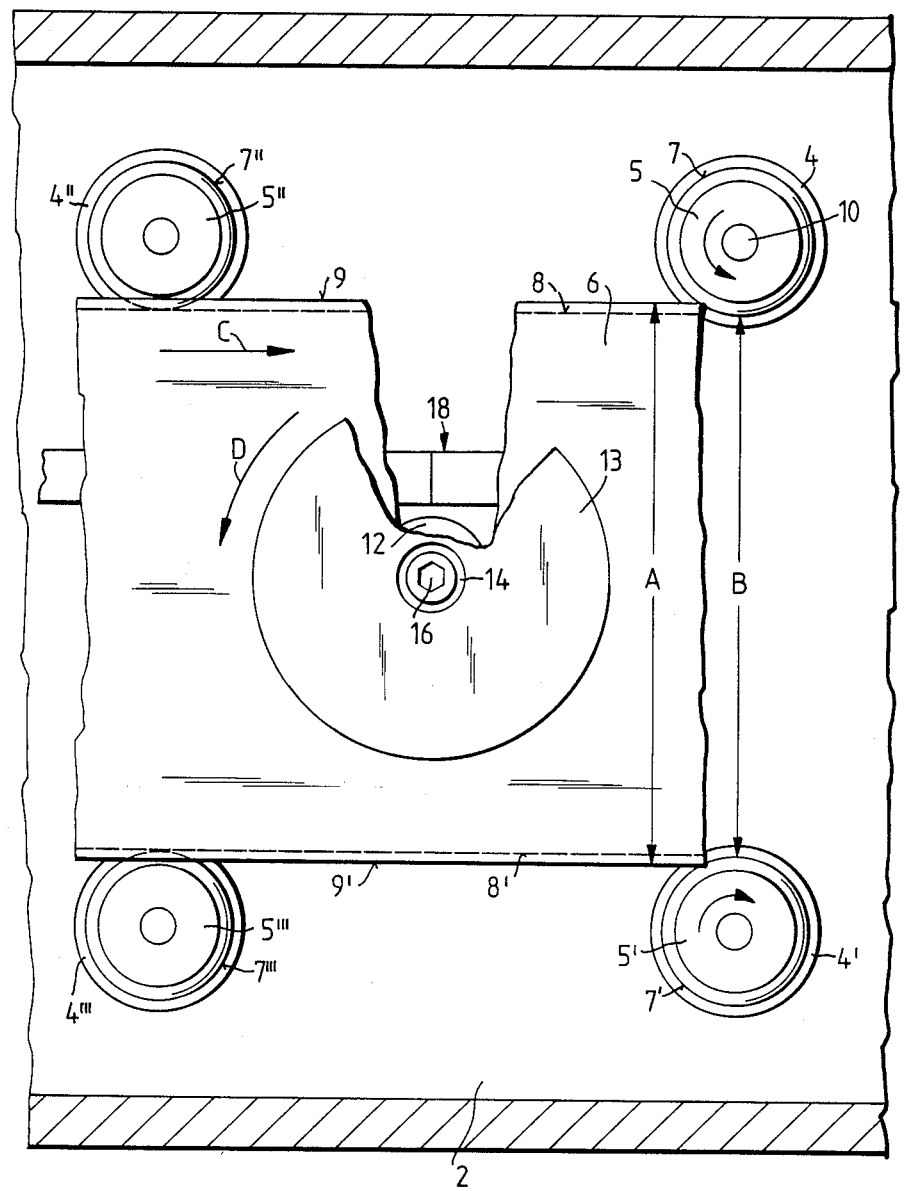
FIG. 3 is an enlarged top view of a section of the substrate carriage.

The apparatus for the production of coatings of uniform thickness profile consists essentially of a machine frame 1 holding a coating chamber 2, the latter having an approximately rectangular cross section. Inside of the coating chamber 2 the sputtering cathode 3 and two parallel rows of bearing posts 4, 4', 4", . . . with guide rollers 5, 5', 5", . . . rotatably mounted on them are disposed, on which the substrate carriage 6 is carried. The coating chamber, open at both ends, corresponds with two air locks not represented in detail in the drawing, which on the one hand permit the substrate carriage 6 to enter and leave (in the direction of arrow C) the coating chamber 2, and on the other hand hermetically seal the interior of the coating chamber 2. The substrate carriage 6 has V-shaped longitudinal grooves 8, 8', created in the two parallel longitudinal edges 9, 9', supporting it on the rollers 5, 5', . . . , whose upper revolving edges 7, 7', are rounded, the distance A between the two longitudinal edges 9, 9', of the substrate carriage 2 being slightly greater than the distance B separating the revolving edges 7, 7', of two oppositely situated guide rollers 5, 5'. The movement of the substrate carriage 6 in the direction C is brought about by driving the rollers 5, 5', 5", . . . through electric motors disposed in the bearing posts 4, 4', 4'', ..., the sense of rotation of the rollers 5, 5', ..., of the one row being the opposite of the sense of rotation of the rollers 5', 5''', ... . of the other row of rollers.

As seen in FIG. 1, magnets 11, 11', ... are disposed in a row under the substrate carriage 6 and the direction of their magnetization is perpendicular to the length of the coating chamber 2. Within the row of individual magnets 11, 11', ... the magnetization of adjacent magnets is antiparallel. During the movement of the substrate carriage 6 in direction C, a disk current is produced in the magnetic disks 12, 12', ..., mounted on the substrate carriage 6, which causes the magnetic disks 12, 12', ... , and the substrate disks 13, 13', ..., joined for co-rotation therewith by hubs 14, 14', ..., 15, 15', ..., to rotate in the direction D.

During the coating process the synchronously revolving rollers 5, 5', ..., transport the substrate carriage 6 slowly in the direction C, while simultaneously the magnetic disks 12, 12', ..., set in rotation by means of the fixed permanent magnets 11, 11', ..., also drive the substrate disks 13, 13', ..., mounted for co-rotation with them.

The above-described apparatus has the advantage that virtually every portion of a workpiece laid or fastened on the substrate disk, e.g., a wafer or a compact disk, will not only be moved in direction C through the coating chamber 2 and past the sputtering cathode 3 at a uniform velocity, but will also move simultaneously transversely of the direction C, so that an especially uniform, or rotationally symmetrical, coating density can be produced. The apparatus is extraordinarily reliable in operation and virtually free of wear. Lubrication or special maintenance of any parts of the drive is unnecessary. In addition, the apparatus operates virtually noise-free, since no noisy gear drives or cogbelt drives are present. Lastly, the coating process can be observed through view windows installed in the wall of the coating chamber 2, since the row of magnets 18 is borne by magnet holders 25 underneath the substrate carriage, permitting an unhampered view of the substrates.

Figure 4:
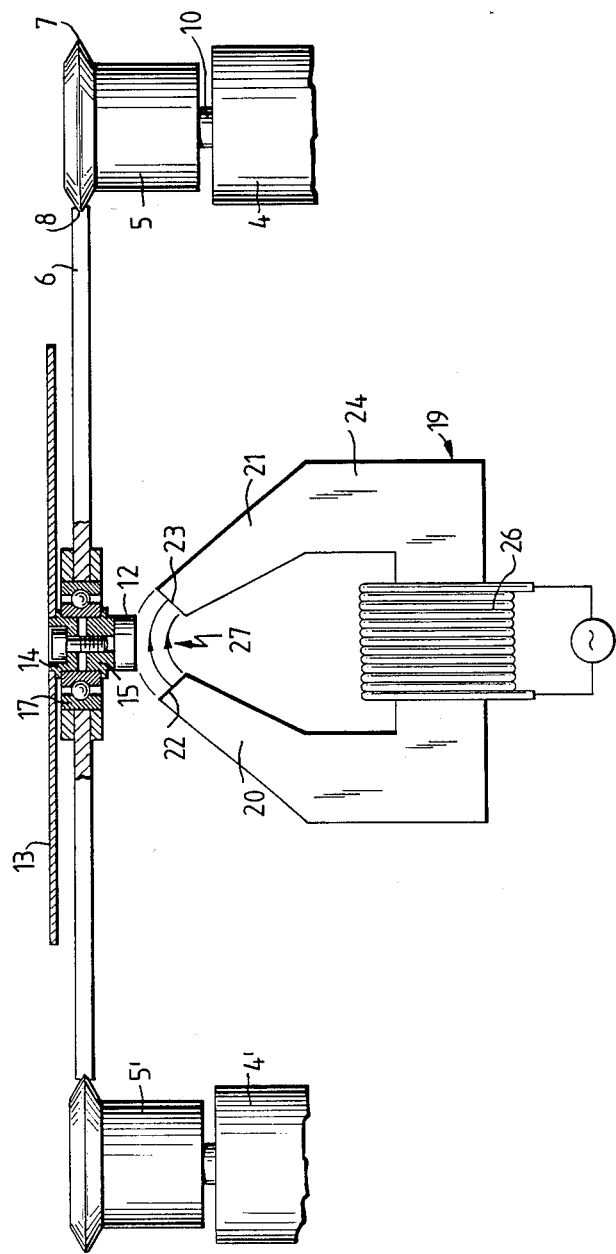
FIG. 4 represents an electromagnet having a yoke whose pole ends are bent toward the magnetic disk fastened to a hub of the substrate disk, the inner faces of the pole ends being parallel to the direction of movement of the substrate carriage.

In the embodiment of the apparatus represented in FIG. 4, an electromagnet 19 is disposed on the side of the substrate carriage 6 facing away from the cathode 3. This electromagnet 19 has an approximately prismatic, elongated yoke 24 with a coil 26 energized by electric current, and two branches 20, 21, whose inner faces 22, 23, are turned toward one another. The two branches 20, 21, together form an elongated gap 27 which is so configured that the magnetic disks 12, 12', ..., run along this gap in the longitudinal movement of the substrate carriage in the direction C. In FIG. 4, therefore, the substrate carriage 6 is represented such that its movement is toward the observer (or away from the observer). Of course, instead of a single electromagnet 19, a plurality of electromagnets can be arranged in tandem, in which case the poles on each side must be in precise alignment so as to prevent contact with any of the magnetic disks 12, 12', ...

We claim:

1. Apparatus for the production of coatings of uniform thickness profile on substrates, especially by cathode sputtering, comprising: a coating chamber, a sputtering cathode held fixedly therein, and a substrate carriage held and guided and movable through the coating chamber transversely of the sputtering cathode, comprising: one or more substrate disks rotatably mounted on the substrate carriage on a side thereof facing the cathode, and said substrate disks having their axes of rotation each disposed across a plane of movement of the substrate carriage, and on a side of the substrate carriage facing away from the cathode a plurality of fixedly mounted magnets arranged in a row in said coating chamber, whose direction of magnetization is in each case perpendicular to a direction of movement of the substrate carriage, the magnetization of two adjacent magnets being in each case antiparallel, and the row of magnets extending in a plane parallel to the plane of movement of the substrate carriage and, cooperating with said row of magnets, magnetic disks which are fastened on a hub and whose direction of magnetization is perpendicular to the hub axis.

2. Apparatus according to claim 1, in which the substrate carriage has bearing bores and is configured as a substantially rectangular plate having an upper side on which a plurality of substrate disks are rotatably mounted, and which apparatus includes the corresponding pivot shafts brought downward through the bearing bores in the substrate carriage and joined for co-rotation to magnetic disks which cooperate with magnets of the magnet row.

3. Apparatus according to claim 1, in which each substrate disk (13, 13', ... ) as well as each corresponding magnetic disk 12, 12', .d ... ) has a hub which are both joined for corotation by a pivot shaft, each hub pair cooperating with a rolling bearing whose bearing cage is held on the substrate carriage.

4. Apparatus according to claim 1, in which the magnet row extends lengthwise of a direction of movement of the substrate carriage and is so arranged that the magnetic disks move directly past, and at a slight distance away from, the individual magnets on their way through the coating chamber.

5. Apparatus according to claim 1, in which the magnet row is disposed laterally beside the magnetic disks rotating with the hubs and directly underneath the substrate carriage and parallel thereto.

6. Apparatus for the production of coatings of uniform thickness profile on substrates, especially by cathode sputtering, comprising: a coating chamber, a sputtering cathode held fixedly in the latter, and a substrate carriage held and guided and movable through the coating chamber across the sputtering cathode, comprising: one or more substrate disks mounted rotatably on the substrate carriage on a side thereof facing the cathode, and said substrate disks having axes of rotation in each case disposed transversely of a plane of movement of the substrate carriage, and on a side of the substrate carriage facing away from the cathode, an electromagnet fixedly disposed in the coating chamber, with a magnet yoke having poles, and magnetic disks which cooperate with the poles and which are fastened each to a hub of the substrate disk, and the magnet yoke having a direction of magnetization perpendicular to the hub axis, the poles having inner faces, turned toward one another, being disposed parallel to a direction of movement of the substrate carriage.

* * * * *